US006452419B1

(12) United States Patent
Ovens

(10) Patent No.: US 6,452,419 B1
(45) Date of Patent: Sep. 17, 2002

(54) CONTROL CIRCUIT HAVING STACKED IC LOGIC

(75) Inventor: Kevin Ovens, Plano, TX (US)

(73) Assignee: Power Signal Technologies, Inc., Richardson, TX (US)

( * ) Notice: Subject to any disclaimer, the term of this patent is extended or adjusted under 35 U.S.C. 154(b) by 0 days.

(21) Appl. No.: 09/834,142

(22) Filed: Apr. 12, 2001

(51) Int. Cl.[7] ........................................ H03K 19/0185

(52) U.S. Cl. ............................ 326/80; 326/80; 326/81; 327/538; 327/546

(58) Field of Search ............. 326/80, 81; 327/538–546; 323/312–315

(56) References Cited

U.S. PATENT DOCUMENTS 5,812,010 A * 9/1998 Houk ......................... 327/381
6,034,562 A * 3/2000 Bonet et al. ................ 327/541
6,099,100 A * 8/2000 Lee ............................ 326/81

* cited by examiner

*Primary Examiner*—Michael Tokar
*Assistant Examiner*—Vibol Tan
(74) *Attorney, Agent, or Firm*—Jackson Walker LLP

(57) ABSTRACT

A stacked logic circuit (20) having a serially connected first logic circuit (12) operating off a first voltage differential and providing in series with a second logic circuit (14) operating off a second voltage differential. The second logic circuit being in series with the first logic circuit recycles the current of the first logic circuit. A low impedance shunt circuit (30) is provided in parallel with the first logic circuit (12) and shunts additional current required of and to the second logic circuit (14) from the single voltage source ($V_{CC}$). A Zener diode (Z1) shunts current from the first logic circuit not required by the second logic circuit via a shunt node (N). The shunt circuit (30) includes a Darlington pair of transistors or a three terminal voltage regulator (42) and only shunts a very small amount of current to ground. The stacked logic circuit of the present invention efficiently uses current drawn by the single voltage source to reduce power consumption.

49 Claims, 2 Drawing Sheets

CONTROL CIRCUIT HAVING STACKED IC LOGIC

FIELD OF THE INVENTION

The present invention is generally related to integrated circuits including those provided logic functions, and more particularly to integrated circuits operating off of more than one voltage supply and having different voltage drops.

BACKGROUND OF THE INVENTION

Integrated circuits (ICs) are widely used in today's electronic equipment and provide the control functions thereof. These ICs can be fabricated according to numerous different semiconductor technologies including CMOS, Bi-polar, BiCMOS, ECL just to name a few. Circuits fabricated of these different semiconductor technologies are adapted to operate off of voltage sources having different nominal voltage requirements. For instance, CMOS devices typically operate off a +5 volt supply, with one pin being tied to ground. Bi-CMOS devices, however, are typically adapted to operate off of a +3.3 volt supply.

In electronic circuits including multiple control circuits adapted to operate off of different power supply voltages, it is conventional to either provide two different voltage sources, or, to provide a voltage source adapted to power one logic circuit, this voltage source being fed to a resistive divide circuit to level shift the voltage down to the nominal operating voltage for the second integrated circuit, as shown in FIG. 1. While these conventional techniques are adequate, they suffer in that the resistive divide network shunts a significant amount of current to ground, which is a power loss. Moreover, each of the different logic circuits, shown at 12 and 14, individually conduct the normal operating currents which are then provided to ground. In this shown example, the 5V logic circuit draws 25 milliamps from the 5 volt supply, the 3.3 V logic circuit draws 40 milliamps, and the resistive divide network shunts 4 milliamps to ground, a total draw of 69 milliamps. Sometimes, the resistive divide network 16 can include a Zener diode in combination with a resistor. However, this combination also undesirably shunts a significant amount of current to ground.

Other equivalents to the resistive divide network include level shifter circuits which can shift voltages up or down. However, these voltage converter circuits shunt a significant amount of current to ground, or, consume a large amount of power themselves.

There is desired an improved multiple logic circuit design having a single voltage supply which incorporates multiple control circuits operating off of different rail-to-rail voltages, which circuit does not shunt a significant amount of current to ground, and further, has increased efficiency and use of current provided by the single voltage supply.

SUMMARY OF THE INVENTION

The present invention achieves technical advantages as a stacked logic circuit whereby two or more logic circuits are arranged in series, and configured between a single voltage source and ground. A novel shunt circuit is provided in parallel with one logic circuit to shunt additional needed current from the voltage source to the second logic circuit via a shunt node, and without shunting a significant amount of current to ground. The second logic circuit being coupled in series with the first logic circuit thereby conducts the first logic circuits current, providing for a recycling of the current. The shunt circuit has a very low impedance such that large swings of current drawn from the voltage source does not significantly effect the voltage at the node between the logic circuits. A second shunt, such as Zener diode, is connected to the shunt node and is in parallel with the other logic circuit to sink current from the first logic circuit that is not conducted by the second logic circuit. Thus, these two shunt circuits provide load balancing for providing extra current to the second logic circuit, or drawing extra current circuit from the first logic circuit, depending on the current load balance.

DETAILED DESCRIPTION OF THE PREFERRED EMBODIMENT

Figure 1:
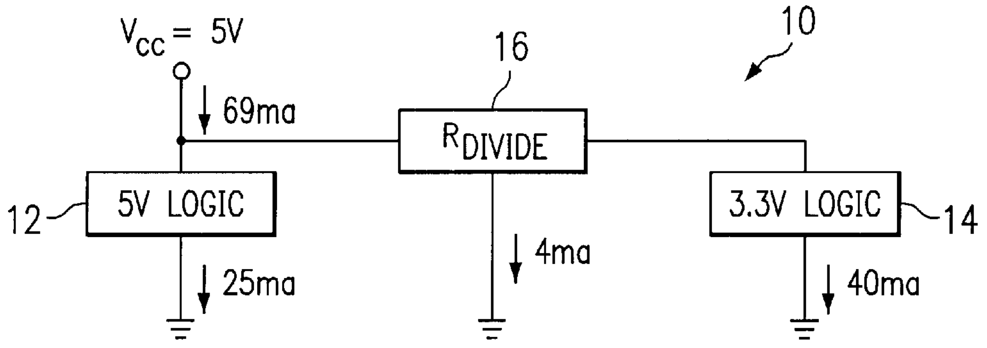
FIG. 1 (PRIOR ART)
FIG. 1 is a block diagram of a conventional logic circuit arrangement implementing a resistive divide network wherein logic circuits adapted to operate off of different voltages are powered by a single voltage source.
Figure 2:
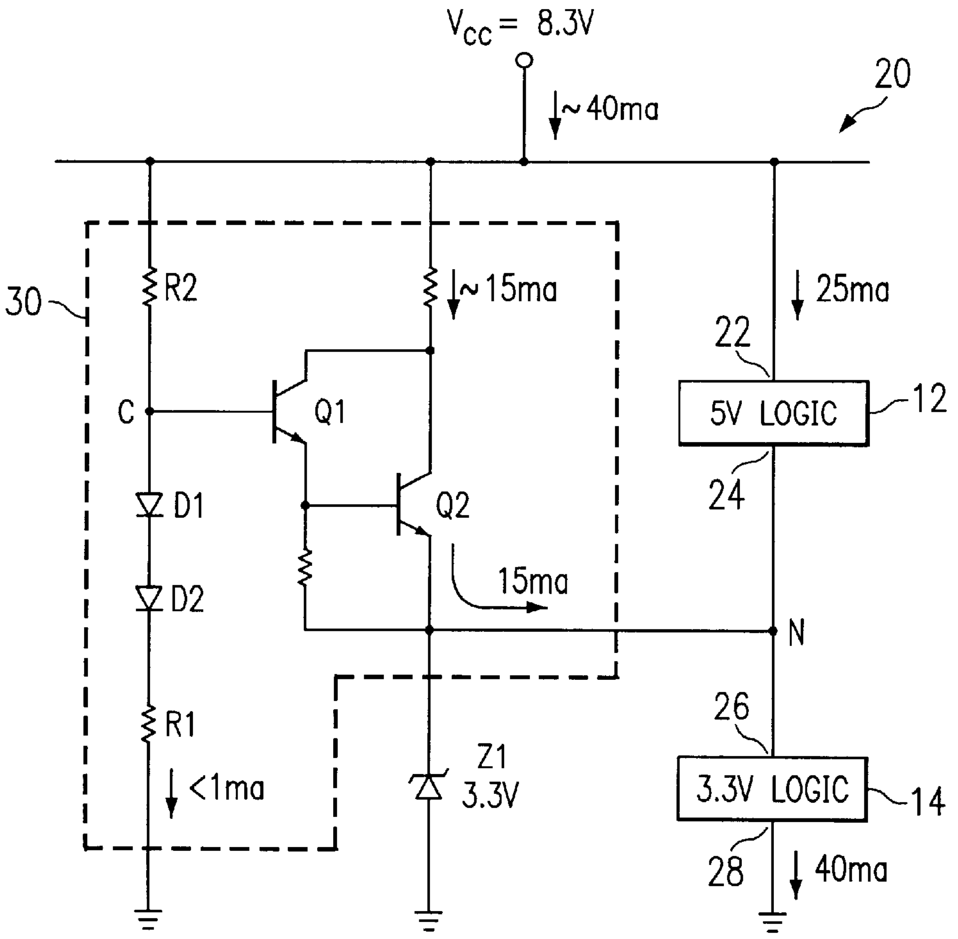
FIG. 2 is a schematic diagram of the present invention depicting logic circuitry stacked in series and provided with a shunt circuit having a very low operating impedance and shunting very little current to ground, whereby the shunt circuit provides extra current to the lower logic circuit.

Referring now to FIG. 2, there is shown generally at 20 a logic circuit arrangement whereby a first IC logic circuit 12 and a second IC logic circuit 14 are connected in series with one another between a single voltage supply $V_{CC}$ and ground. As shown, for purposes of illustration but without limitation thereto, the first logic circuit is seen to operate with a 5 volt voltage differential provided between a first voltage rail 22 and a second voltage rail 24. The second integrated circuit 14 is seen to operate with a 3.3 volt differential provided between a third voltage rail 26 and a fourth voltage rail 28. The single $V_{CC}$ supply thus has a 8.3 V potential. The second voltage rail 24 of the first logic circuit 12 is seen to be connected directly to the third voltage rail 26 of second logic circuit 14 and defining a node N therebetween. Advantageously, in this embodiment the second logic circuit 14 is seen to conduct all of the operating current of the first logic circuit 12, thus providing the recycling of current and achieving the technical advantages of the circuit 20 requiring less operating current to be provided by the single operating voltage source $V_{CC}$.

Still referring to FIG. 2 the present invention is seen to further include a low impedance shunt circuit 30 connected in parallel with the first logic circuit 12, between the voltage source $V_{CC}$ and node N, as shown. Advantageously, this shunt circuit 30 shunts or pushes additional needed current from voltage source $V_{CC}$ to the second logic circuit 14 that is not drawn by the first logic circuit 12. By way of illustration, if, for instance, the first logic circuit 12 requires 25 milliamps of current, and the second logic circuit 14 requires 40 milliamps of current, shunt circuit 30 is adapted to conduct the additional 15 milliamps of current such that a total 40 milliamps of current is provided to and conducted by the second logic circuit 14. The shunt circuit 30 is seen to comprise of a first NPN Bi-polar transistor Q1, and a second Bi-polar transistor Q2 configured in a Darlington pair arrangement.

Advantageously, the shunt circuit 30 does not shunt a significant amount of current to ground. In this illustration, less than 1 milliamp of current is shunted to ground by shunt circuit 30 and is shown to be conducted by a biasing resistor R1. Moreover, the current drawn by logic circuit 12 is recycled by logic circuit 14.

Advantageously, this Darlington pair of transistors provides for conducting a large amount of current while having a very low operating impedance, in this example of about 5 Ohms. For purposes of comparison, if a Zener diode was provided in place of this Darlington pair, the Zener diode would have approximately a 100 Ohm impedance which would otherwise lead to a large voltage swing at node N as the shunt current varies. This varying voltage at node N would be 2 volts when 20 milliamps of current would adversely effect the operation of the first logic circuit 12. In this example, however, the Darlington pair of transistors conducting a variable 20 milliamp current is conducted, and would only provide a variable voltage drop of about 0.1 volt.

The only current shunted to ground by the shunt circuit 30 is that through the biasing circuitry of the Darlington pair seen to comprise of diodes D1, D2, and resistors R1 and R2. The values of resistors R1 and R2 are rather large, and are chosen to have a ratio to establish a biasing voltage at control node C to be two diodes drops above the voltage established at node N. In this example, with a node voltage of 3.3 volts at node N, a control voltage of 4.7 volts is established at the base of transistor Q1 which is seen to be node C.

Figure 3:
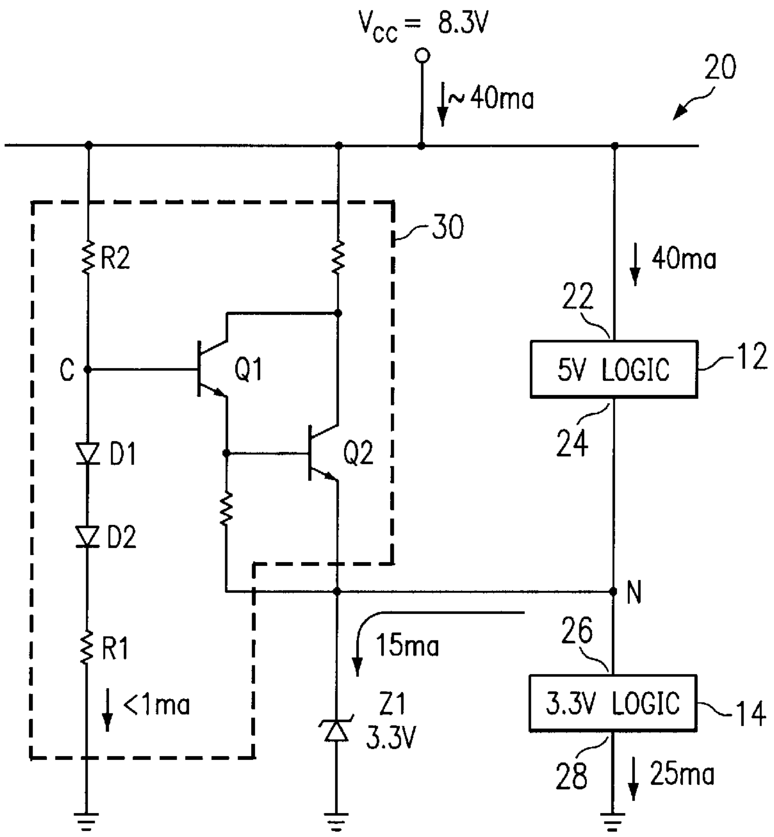
FIG. 3 is a schematic diagram of the Zener diode acting as a second shunt to draw or sink extra current from the first logic circuit that is not needed or conducted by the second logic circuit.

Referring now to FIG. 3, there is illustrated an embodiment whereby the second logic circuit 14 draws less current than the first logic circuit 12, and the Zener diode Z1 pulls or sinks the additional current not required by the second logic circuit 14 to ground. Zener diode Z1 is connected to the shunt node N, and in this embodiment sinks the additional 15 milliamps from the first logic circuit 12 that is not required to be conducted by the second logic circuit 14.

Advantageously, the shunt circuit 30 and the shunt diode Z1 together provide for a push-pull arrangement of current to/from the shunt node N, whereby additional current can be pushed, or additional current can be drawn from the shunt node N, depending on the load balance of current, that is, whether or not the second logic circuit needs more current or less current than that conducted by the first logic circuit 12.

Figure 4:
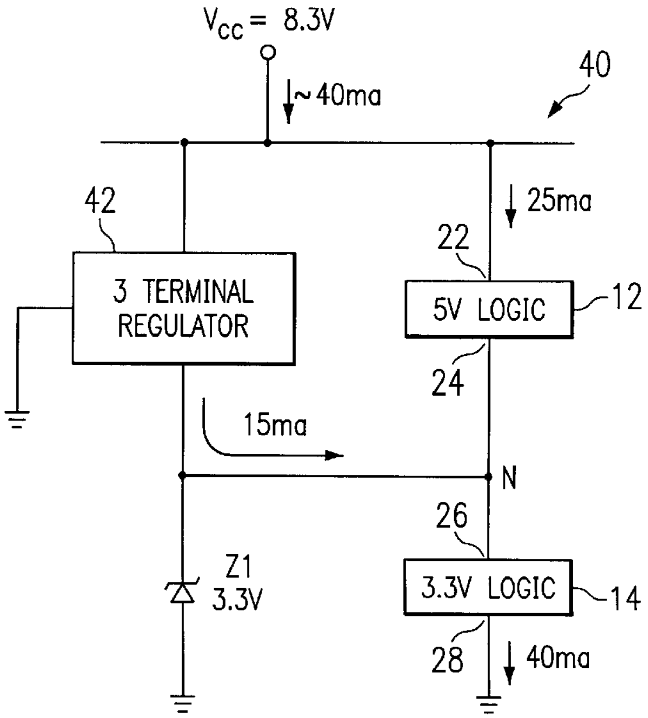
FIG. 4 is a schematic diagram of an alternative embodiment with a three terminal regulator being used as a shunt.

Referring now to FIG. 4, there is illustrated another embodiment of the present invention shown at 40, whereby a three terminal regulator 42 is provided in place of the shunt circuit 30 depicted in FIGS. 2 and 3. This three terminal regulator is a conventional part in the industry typically utilized to provide a regulated voltage to a circuit and operating off a higher voltage source. However, in this embodiment the present invention achieves technical advantages by utilizing the three terminal regulator 42 as a low impedance current shunt rather than a voltage regulator. Similar to the shunt circuit 30 showing FIG. 2 and FIG. 3, the three terminal regulator 42 pushes extra current to the shunt node N when the second logic circuit 14 needs to conduct more current than the first logic circuit 12, as shown. In the other instance when the first logic circuit 12 conducts more current than that of the second logic circuit 14, the three terminal regulator 40 is inactive, and extra current is sunk from the shunt node N via the Zener diode Z1 to ground as previously described in reference to FIG. 3.

While a Darlington pair transistor Q1 and Q2 is seen to comprise of the shunt current circuit 30, it is to be understood that only a single transistor could be provided if desired, although the operating impedance would be slightly higher than the Darlington pair provided for in the present invention. Moreover, the transistors Q1 and Q2 providing a portion of the shunt circuit 30 could also be provided of different semiconductor technologies, such as FETs based on CMOS technologies. Hence, limitation to the number or configuration of the transistors, or the technologies of the control circuitry in the shunt circuit 30 is not to be inferred. The circuit 20 of FIG. 2 illustrates a preferred implementation for providing stacked IC logic circuits, with one logic circuit recycling current of the other, and the implementation of a shunt circuit having a very low operating impedance while shunting very little current to ground.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A stacked logic circuit, comprising:

a first logic circuit coupled to a first node;

a second logic circuit coupled in series between said first logic circuit and a second node and having a shunt node therebetween; and a shunt circuit coupled between said first node and said shunt node and adapted to conduct shunt current, wherein said second logic circuit conducts substantially all current conducted by said first logic circuit and said shunt circuit.

2. The stacked logic circuit as specified in claim 1 further comprising a current shunt coupled between said shunt node and said second node, and conducting current from the shunt node not conducted by he second logic circuit.

3. The stacked logic circuit as specified in claim 1 wherein said shunt circuit comprises a first and second transistor forming a Darlington pair of transistors conducting said shunt current.

4. The stacked logic circuit as specified in claim 3 further comprising a bias circuit driving said second transistor.

5. The stacked logic circuit as specified in claim 4 wherein said bias circuit comprises at least one diode and a resistor in series.

6. The stacked logic circuit as specified in claim 5 further comprising a bias resistor coupled between said first node and said bias circuit.

7. The stacked logic circuit as specified in claim 1 wherein said first logic circuit and said second logic circuit have different voltage drops.

8. The stacker logic circuit as specified in claim 2 wherein said current shunt comprises a Zener diode.

9. The stack logic circuit as specified in claim 7 wherein first logic circuit has approximately a 5 volt drop and said second logic circuit has approximately a 3.3 volt drop.

10. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node; and a shunt circuit adapted to conduct shunt current between said first voltage rail and said shunt node, wherein said second logic circuit conducts substantially all current conducted by said first logic circuit and said shunt current.

11. The stacked logic circuit as specified in claim 10 further comprising a current shunt connected between said shunt node and said fourth voltage rail, said current shunt conducting current from the shunt node not conducted by the second logic circuit.

12. The stacked logic circuit as specified in claim 9 wherein said shunt circuit further comprises a Darlington pair of transistors conducting said shunt current.

13. The stacked logic circuit as specified in claim 12 further comprising a bias circuit driving said second Darlington pair of transistors.

14. The stacked logic circuit as specified in claim 13 wherein said bias circuit comprises at lease one diode and a resistor in series.

15. The stacked logic circuit as specified in claim 14 further comprising a bias resistor coupled between said first voltage rail and said bias circuit.

16. The stacked logic circuit as specified in claim 14 wherein said shunt circuit comprises a Darlington pair of transistors.

17. The stacked logic circuit as specified in claim 10 wherein said first logic circuit and said second logic circuit have different voltage drops.

18. The stacked logic circuit as specified in claim 10 wherein first logic circuit and said second logic circuit both IC's.

19. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node;

a first shunt circuit adapted to conduct shunt current between said first voltage rail and said shunt node; and a second shunt circuit adapted to conduct shunt current between said shunt node and said forth voltage rail, wherein said second logic circuit conducts substantially all current conducted by said first logic circuit.

20. The stacked logic circuit as specified in claim 19 wherein said second current shunt conducts current from the shunt node not conducted by the second logic circuit.

21. The stacked logic circuit as specified in claim 20 wherein said first current shunt conducts current from the first voltage rail to the shunt node not conducted by the first logic circuit.

22. The stacked logic circuit as specified in claim 19 wherein said first shunt circuit comprises a Darlington pair of transistors.

23. The stacked logic circuit as specified in claim 22 wherein said second shunt circuit comprises a Zener diode.

24. The stacked logic circuit as specified in claim 22 further comprising a bias circuit driving said second Darlington pair of transistors.

25. The stacked logic circuit as specified in claim 24 further comprising a bias resistor coupled between said first voltage rail and said bias circuit.

26. The stacked logic circuit as specified in claim 19 wherein said first logic circuit and said second logic circuit have different voltage drops.

27. The stacked logic circuit as specified in claim 19 wherein first logic circuit and said second logic circuit both IC's.

28. A stacked logic circuit, comprising:

a first logic circuit coupled to a first node;

a second logic circuit coupled in series between said first logic circuit and a second node and having a shunt node therebetween;

a shunt circuit coupled between said first node and said shunt node and adapted to conduct shunt current;

a current shunt coupled between said shunt node and said second node, and conducting current from the shunt node not conducted by the second logic circuit.

29. A stacked logic circuit, comprising:

a first logic circuit coupled to a first node;

a second logic circuit coupled in series between said first logic circuit and a second node and having shunt node therebetween; and a shunt circuit coupled between said first node and said shunt node and adapted to conduct shunt current, wherein said shunt circuit comprises a first and second transistor forming a Darlington pair of transistors conducting said shunt current.

30. The stacked logic circuit as specified in claim 29 further comprising a bias circuit driving said second transistor.

31. The stacked logic circuit as specified in claim 30 wherein said bias circuit comprises at least one diode and a resistor in series.

32. The stacked logic circuit as specified in claim 31 further comprising a bias resistor coupled between said first node and said bias circuit.

33. The stacked logic circuit as specified in claim 1 wherein said first logic circuit and said second logic circuit have different voltage drops.

34. The stacked logic circuit as specified in claim 28 wherein said current shunt comprises a Zener diode.

35. The stacked logic circuit as specified in claim 33 wherein first logic circuit has approximately a 5 volt drop and said second logic circuit has approximately a 3.3 volt drop.

36. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node;

a shunt circuit adapted to conduct shunt current between said first voltage rail and said shunt node; and a current shunt connected between said shunt node and said fourth voltage rail, said current shunt conducting current from the shunt node not conducted by the second logic circuit.

37. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node; and a shunt circuit adapted to conduct shunt current between said first voltage rail and said shunt node, wherein said shunt circuit further comprises a Darlington pair of transistors conducting said shunt current.

38. The stacked logic circuit as specified in claim 37 further comprising a bias circuit driving said second Darlington pair of transistors.

39. The stacked logic circuit as specified in claim 38 wherein said bias circuit comprises at least one diode and a resistor in series.

40. The stacked logic circuit as specified in claim 39 further comprising a bias resistor coupled between said first voltage rail and said bias circuit.

41. The stacked logic circuit as specified in claim 39 wherein said shunt circuit comprises a Darlington pair of transistors.

42. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node; and a shunt circuit adapted to conduct shunt current between said first voltage rail and said shunt node, wherein said first logic circuit and said second logic circuit have different voltage drops.

43. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node;

a first shunt circuit adapted to conduct shunt current between said first voltage rail and said shunt node; and a second shunt circuit adapted to conduct shunt current between said shunt node and said forth voltage rail, wherein said second current shunt conducts current from the shunt node not conducted by the second logic circuit.

44. The stacked logic circuit as specified in claim 43 wherein said first current shunt conducts current from the first voltage rail to the shunt node not conducted by the first logic circuit.

45. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node;

a first shunt circuit adapted to conduct shunt current between said first voltage rail and said shunt node; and a second shunt circuit adapted to conduct shunt current between said shunt node and said forth voltage rail, wherein said first shunt circuit comprises a Darlington pair of transistors.

46. The stacked logic circuit as specified in claim 45 wherein said second shunt circuit comprises a Zener diode.

47. The stacked logic circuit as specified in claim 45 further comprising a bias circuit driving said second Darlington pair of transistors.

48. The stacked logic circuit as specified in claim 47 further comprising a bias resistor coupled between said first voltage rail and said bias circuit.

49. A stacked logic circuit, comprising;

a first logic circuit having a first and second voltage rail;

a second logic circuit coupled in series with said first logic circuit and having a third and fourth voltage rail, said third voltage rail being coupled to said second voltage rail at a shunt node;

a first shunt circuit adapted to conduct shunt current between said first voltage rail and said shunt node; and a second shunt circuit adapted to conduct shunt current between said shunt node and said forth voltage rail, wherein said first logic circuit and said second logic circuit have different voltage drops.

* * * * *